(12) United States Patent
Singh

(10) Patent No.: US 10,917,129 B2
(45) Date of Patent: Feb. 9, 2021

(54) CIRCUIT FOR DETERMINING WHETHER AN ACTUAL TRANSMISSION WAS RECEIVED IN A LOW-VOLTAGE DIFFERENTIAL SENSING RECEIVER

(71) Applicant: STMicroelectronics International N.V., Schiphol (NL)

(72) Inventor: Prashant Singh, Greater Noida (IN)

(73) Assignee: STMicroelectronics International N.V., Schiphol (NL)

(*) Notice: Subject to any disclaimer, the term of this patent is extended or adjusted under 35 U.S.C. 154(b) by 71 days.

(21) Appl. No.: 15/812,086

(22) Filed: Nov. 14, 2017

(65) Prior Publication Data

US 2019/0149180 A1  May 16, 2019

(51) Int. Cl.
| H04B 1/10 | (2006.01) |
| H03K 5/24 | (2006.01) |
| H03K 19/20 | (2006.01) |
| H03K 3/027 | (2006.01) |
| H03K 19/0185 | (2006.01) |
| H03H 11/04 | (2006.01) |
| H04L 25/02 | (2006.01) |
| H03H 11/12 | (2006.01) |

(52) U.S. Cl.
CPC ........... *H04B 1/1027* (2013.01); *H03H 11/04* (2013.01); *H03K 3/027* (2013.01); *H03K 5/24* (2013.01); *H03K 19/018528* (2013.01); *H03K 19/20* (2013.01); *H04L 25/0292* (2013.01); *H03H 11/1213* (2013.01)

(58) Field of Classification Search
CPC ...... H04B 1/1027; H03H 11/04; H03K 3/027; H03K 5/24
See application file for complete search history.

(56) References Cited

U.S. PATENT DOCUMENTS

| 4,760,354 | A  | * | 7/1988  | Kianush | ................... | H03C 1/60 |
|           |    |   |         |         |                    | 332/108  |
| 6,288,577 | B1 |   | 9/2001  | Wong    |                    |          |
| 6,650,149 | B1 |   | 11/2003 | Wong    |                    |          |
| 6,781,456 | B2 | * | 8/2004  | Pradhan | ..................... | H03F 3/68 |
|           |    |   |         |         |                    | 326/14   |
| 7,397,269 | B2 | * | 7/2008  | Ishibashi | .............. | G01R 31/025 |
|           |    |   |         |         |                    | 326/14   |
| 7,747,807 | B2 | * | 6/2010  | Komatsu | ............... | G06F 1/3203 |
|           |    |   |         |         |                    | 710/15   |
| 10,153,757 | B2 | * | 12/2018 | van Eeden | ............. | H03K 19/21 |

\* cited by examiner

*Primary Examiner* — Lincoln D Donovan
*Assistant Examiner* — Colleen J O Toole
(74) *Attorney, Agent, or Firm* — Crowe & Dunlevy

(57) ABSTRACT

A circuit has a first window comparator determining whether a signal at a first input has a voltage higher than a first threshold but lower than a second threshold, and a second window comparator determining whether a signal at a second input has a voltage higher than the first threshold but lower than the second threshold. A logic circuit generates pulses in response to either the first window comparator determining that the signal at the first differential input has a voltage higher than the first threshold but lower than the second threshold or the second window comparator determining that the signal at the second input has a voltage higher than the first threshold but lower than the second threshold. A filter circuit receives the pulses from the logic circuit and generates a flag indicating that the signal is invalid, based upon pulses received from the logic circuit.

16 Claims, 7 Drawing Sheets

CIRCUIT FOR DETERMINING WHETHER AN ACTUAL TRANSMISSION WAS RECEIVED IN A LOW-VOLTAGE DIFFERENTIAL SENSING RECEIVER

TECHNICAL FIELD

This disclosure is related to the field of low-voltage differential sensing receivers, and, in particular, to a circuit for determining whether a received signal is a valid signal (e.g. an actual received transmission) or noise.

BACKGROUND

Low-voltage differential sensing receivers are useful electronic devices that have a high gain, operate at high speeds, and are capable of amplifying a small differential signal to logic levels suitable for use in transistor to transistor logic. Due to the high gain, as well as tight threshold, of these receivers, if noise is received and interpreted as a valid signal, a low-voltage differential sensing receiver can oscillate in response to input differential noise.

Attempts have been made at mitigating the effect of noise on low-voltage differential sensing receivers. For example, a bias network can be used to maintain a DC offset in the absence of a valid signal. However, this can distort the output signal, and possibly reduce the amplitude of the input signal, resulting in the output of the low-voltage differential sensing receiver switching in response to input noise.

Therefore, it is desirable for a circuit to differentiate valid signals from noise, in low-voltage differential sensing receivers.

SUMMARY

Disclosed herein is a first window comparison circuit configured to determine whether a signal at a first differential input has a voltage that is higher than a first threshold voltage but lower than a second threshold voltage greater than the first threshold voltage. A second window comparison circuit is configured to determine whether a signal at a second differential input has a voltage that is higher than the first threshold voltage but lower than the second threshold voltage. A logic circuit is configured to generate pulses indicating presence of noise in the signals at the first and second differential inputs, each pulse being generated in response to either the first window comparison circuit determining that the signal at the first differential input has a voltage higher than the first threshold voltage but lower than the second threshold voltage or the second window comparison circuit determining that the signal at the second differential input has a voltage higher than the first threshold voltage but lower than the second threshold voltage. A filter circuit is configured to receive the pulses from the logic circuit and to generate a flag indicating that the signal is invalid, based upon pulses received from the logic circuit.

A threshold may generating circuit may include a first resistor coupled between a power supply node and a first node, a second resistor coupled between the first node and a first center node, a third resistor coupled between the first center node and a second node, a fourth resistor coupled between the second node and a ground node, a fifth resistor coupled between the power supply node and a third node, a sixth resistor coupled between the third node and a second center node, a seventh resistor coupled between the second center node and a fourth node, an eighth resistor coupled between the fourth node and the ground node, and a first differential resistor coupled between the first and second center nodes. The first threshold voltage is produced at the first node, and the second threshold voltage is produced at the fourth node.

The second, third, sixth, and seventh resistors each may have a first same resistance value, and wherein the first, fourth, fifth, and eighth resistors each may have a second same resistance value. The second same resistance value may be different than the first same resistance value.

The first window comparison circuit may include a first comparator having a non-inverting input coupled to the first threshold voltage, an inverting input coupled to the first differential input, and an output. The first window comparison circuit may also include a second comparator having a non-inverting input coupled to the second threshold voltage, an inverting input coupled to the first differential input, and an output. A first exclusive OR gate may have inputs coupled to the outputs of the first and second comparators, and an output.

The second window comparison circuit may include a third comparator having a non-inverting input coupled to the first threshold voltage, an inverting input coupled to the second differential input, and an output. The second window comparison circuit may also include a fourth comparator having a non-inverting input coupled to the second threshold voltage, an inverting input coupled to the second differential input, and an output. A second exclusive OR gate may have inputs coupled to the outputs of the third and fourth comparators, and an output.

The logic circuit may be an AND gate having inputs coupled to the outputs of the first and second exclusive OR gates, with the AND gate producing the pulses indicating the presence of noise in the signals at the first and second differential inputs.

The circuit may also include a current balancing circuit with a ninth resistor coupled between the power supply node and a fifth node, a tenth resistor coupled between the fifth node and a third center node, an eleventh resistor coupled between the third center node and a sixth node, a twelfth resistor coupled between the sixth node and the ground node, a thirteenth resistor coupled between the power supply node and a seventh node, a fourteenth resistor coupled between the seventh node and a fourth center node, a fifteenth resistor coupled between the fourth center node and an eighth node, a sixteenth resistor coupled between the eighth node and the ground node, and a second differential resistor coupled between the third and fourth center nodes. The first differential input may be coupled to the third center node, and the second differential input may be coupled to the fourth center node. A receiver may have differential inputs coupled to the first and second differential inputs. A control circuit may be configured to ignore output from the receiver based upon the flag indicating that the signals at the first and second different inputs are invalid.

The first, fourth, fifth, eighth, ninth, twelfth, thirteenth, and sixteenth resistors may have a first same resistance value, and the second, third, sixth, seventh, tenth, eleventh, fourteenth, and fifteenth resistors may have a second same resistance value different than the first same resistance value. The receiver may be a low-voltage differential signaling (LVDS) receiver

DETAILED DESCRIPTION

In the following description, numerous details are set forth to provide an understanding of the present disclosure. It will be understood by those skilled in the art, however, that the embodiments of the present disclosure may be practiced without these details and that numerous variations or modifications from the described embodiments may be possible.

Figure 1:
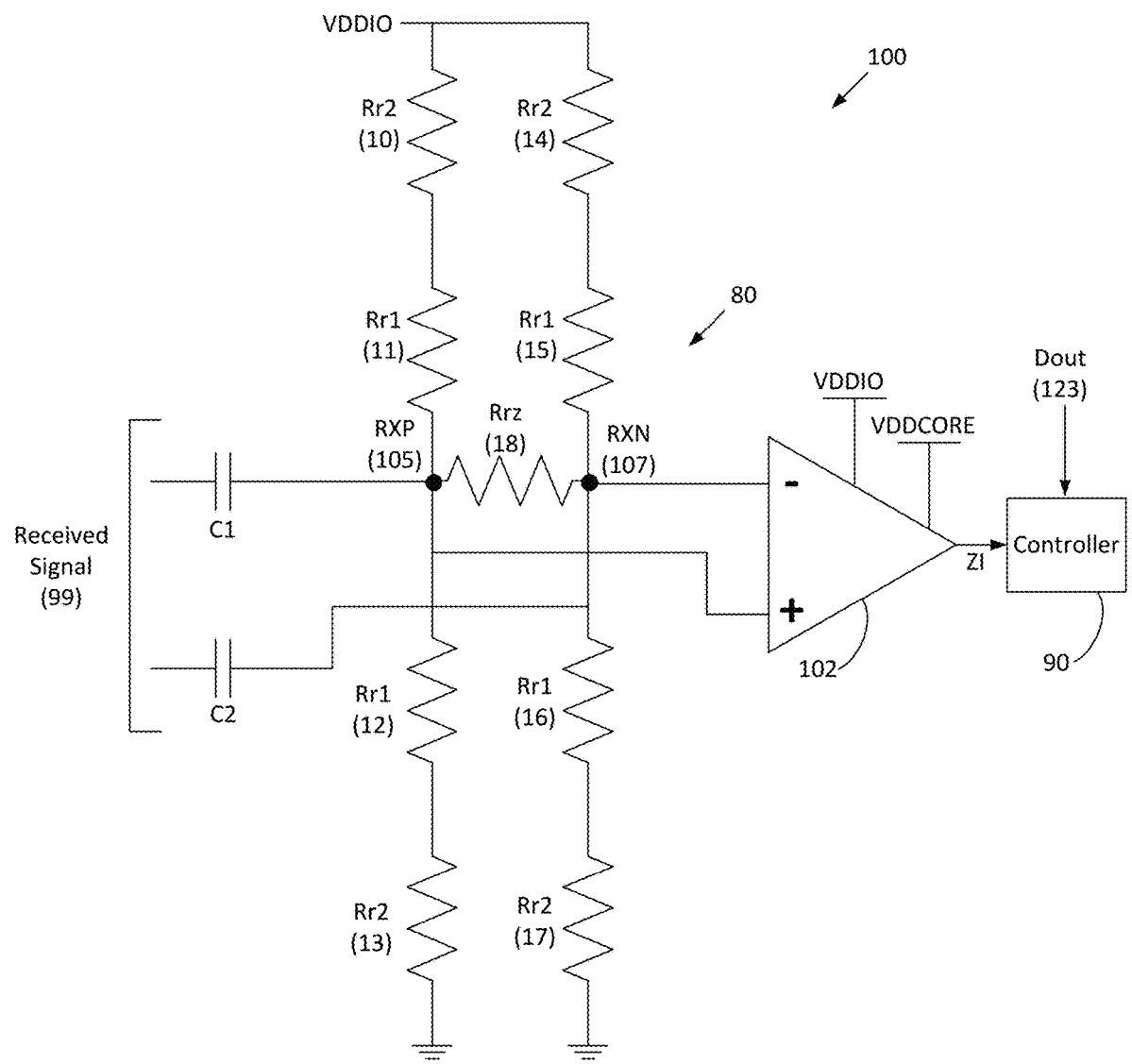
FIG. 1 is a schematic diagram of a low-voltage differential sensing receiver.

With initial reference to FIG. 1, a low-voltage differential sensing receiver 100 is now described. The low-voltage differential sensing receiver 100 includes an H-bridge voltage divider 80. The H-bridge voltage divider 80 includes resistors 10, 11 that are coupled in series between a power supply node VDDIO and node 105. Resistors 12, 13 are coupled in series between node 105 and ground. Resistors 14, 15 are coupled in series between the power supply node VDDIO and node 107. Resistors 16, 17 are coupled in series between node 107 and ground. Resistors 11, 12, 15, 16 each have the same resistance value of Rr1. Resistors 10, 13, 14, 17 each have a same resistance value Rr2. A resistor 18, having a resistance value of Rrz, is coupled between nodes 105 and 107.

A received differential signal 99 is capacitively coupled to node 105 as signal RXP through capacitor C1. The received signal 99 is also capacitively coupled to node 107 as signal RXN through capacitor C2. RXP and RXN therefore collectively represent the differential signal 99. A differential amplifier 102 is powered by supply nodes VDDIO and VDDCORE to provide for a level shifting operation, has an inverting input coupled to node 107, and has a non-inverting input coupled to node 105. The output ZI of the differential amplifier 102 is coupled to a controller 90. The controller 90 receives a Dout flag 123, which indicates whether the received differential signal 99 is an invalid signal. If the Dout flag 123 is asserted, therefore indicating that the received differential signal 99 is an invalid signal, then the controller 90 ignores the output ZI from the differential amplifier 102. If, however, the Dout flag 123 is not asserted, indicating that the received differential signal 99 is a valid signal, then the controller 90 proceeds with processing the output ZI of the differential amplifier 102.

Figure 2A:
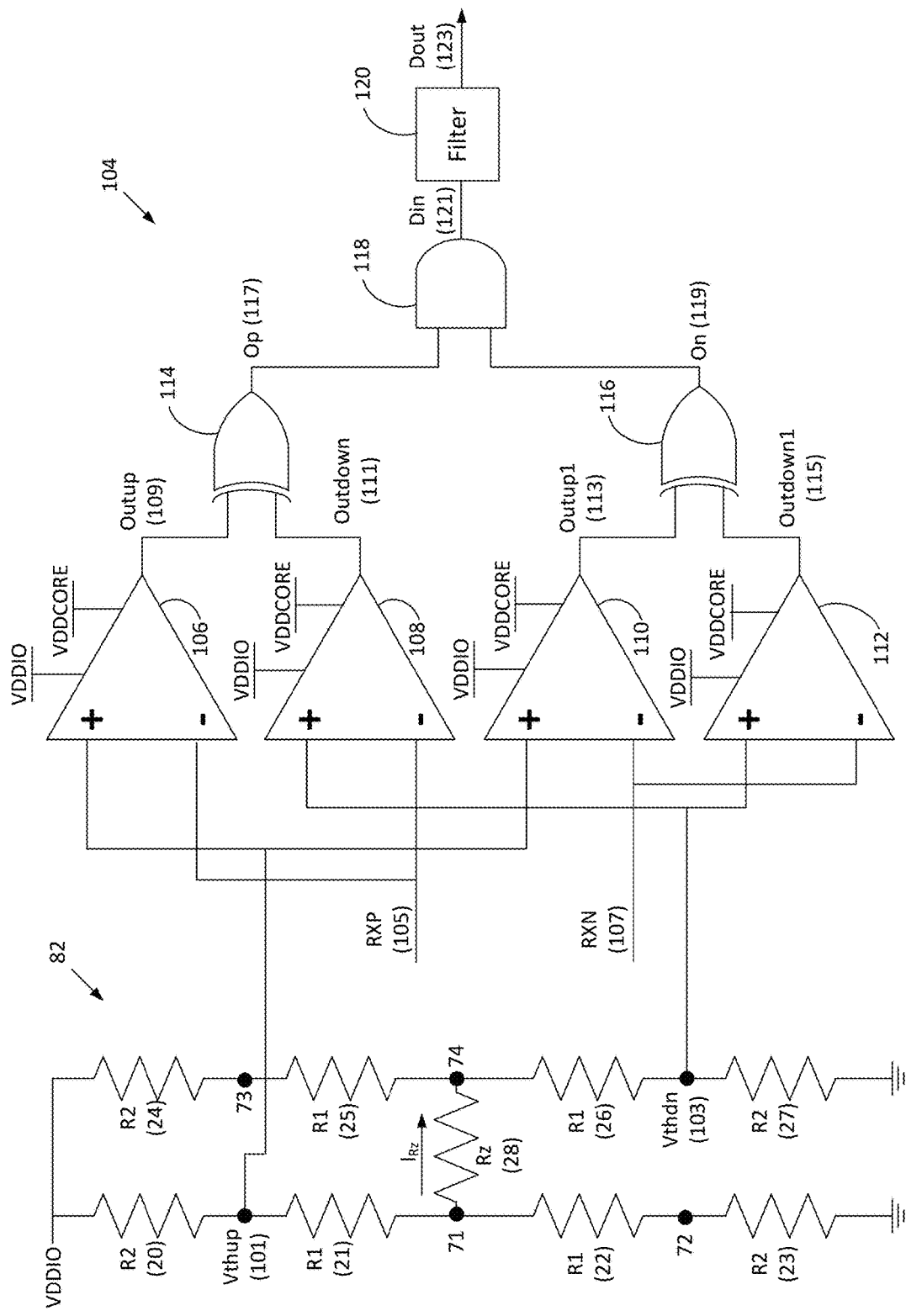
FIG. 2A is a schematic block diagram of a circuit for determining whether a received signal is a valid signal, and for generating a flag indicating same.

With reference to FIG. 2A, a circuit 104 for determining whether the received signal 99 is a valid signal and generating the Dout flag 123 based thereupon is now described. The circuit 104 includes an H-bridge voltage divider 82 similar to the H-bridge voltage divider 80.

The H-bridge voltage divider 82 includes a resistor 20 coupled between the power supply node VDDIO and node 101. Resistor 21 is coupled between node 101 and node 71. Resistor 22 is coupled between node 71 and node 72. Resistor 23 is coupled between node 72 and ground. Resistor 24 is coupled between power supply node VDDIO and node 73. Resistor 25 is coupled between node 73 and node 74. Resistor 26 is coupled between node 74 and node 103. Resistor 27 is coupled between node 103 and ground. Resistor 28 is coupled between node 71 and 74. A first threshold voltage Vthup is generated at node 101, and a second threshold voltage Vthdn is generated at node 103. Resistors 21, 22, 25, 26 each have a same resistance value R1, which may be equal to Rr1. Resistors 20, 23, 24, 27 each have a same resistance value R2, which may be equal to Rr2.

Vthup can be calculated as:

$$Vthup = Vcc \frac{2R1 + R2}{2R1 + 2R2}$$

Vthdn can be calculated as:

$$Vthdn = Vcc \frac{R2}{2R1 + 2R2}$$

Differential amplifier 106 has a non-inverting input coupled to receive the first threshold voltage Vthup at node 101, and an inverting input coupled to node 105 to receive the RXP signal. Differential amplifier 108 has a non-inverting input coupled to receive the second threshold voltage Vthdn, and an inverting input coupled to node 105 to receive the RXP signal. The output Outp 109 of differential amplifier 106 and the output Outdown 111 are coupled to the inputs of exclusive OR gate 114.

Differential amplifier 110 has a non-inverting input coupled to receive the first threshold voltage Vthup at node 101, and an inverting input coupled to node 107 to receive the RXN signal. Differential amplifier 112 has a non-inverting input coupled to receive the second threshold voltage Vthdn, and an inverting input coupled to node 107 to receive the RXN signal. The output Outp1 113 of differential amplifier 110 and the output Outdown1 115 are coupled to the inputs of exclusive OR gate 116.

The output Op 117 of exclusive OR gate 114 and output On 119 of exclusive OR gate 116 are coupled to the inputs of AND gate 118. The output of AND gate 118 is a Din signal 121. Filter 120 is an integrating filter that filters the Din signal 121. The output of filter 120 is the Dout signal 123, which is the flag that indicates whether the received differential signal 99 is a valid signal.

Figure 2B:
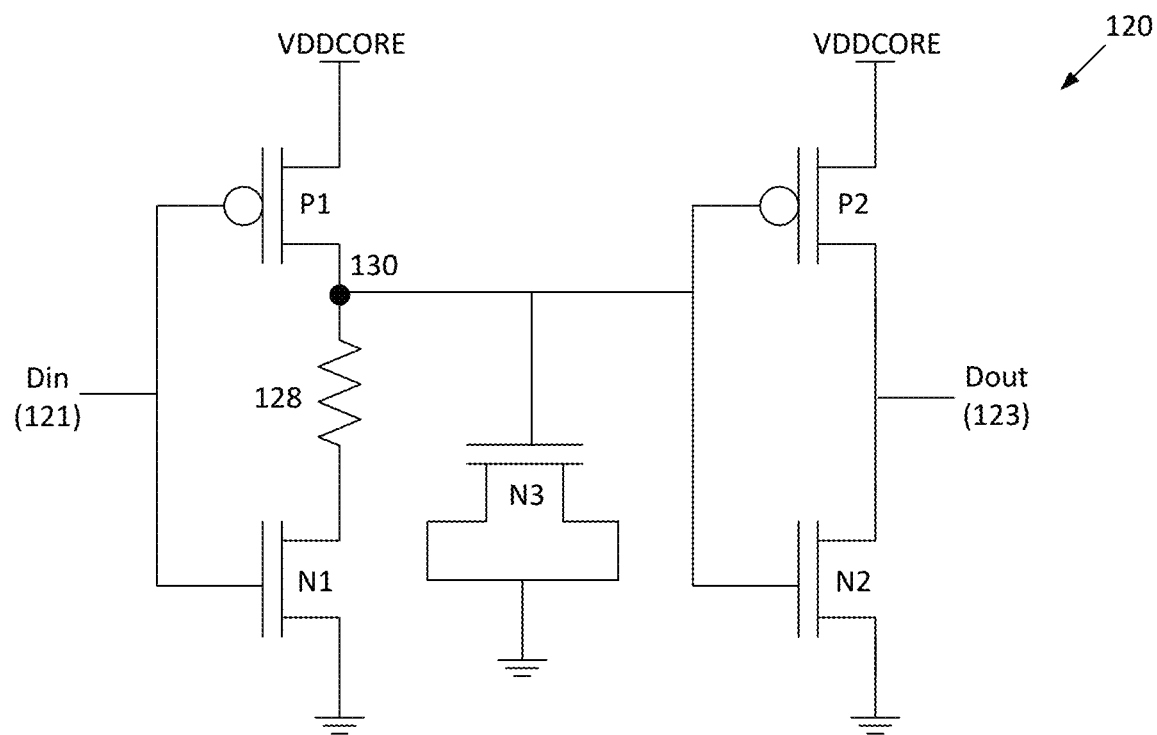
FIG. 2B is a schematic diagram of the filter of FIG. 2A.

Further details of the filter 120 are shown in FIG. 2B. Here, it can be seen that the filter 120 includes PMOS transistor P1 having its source coupled to VDDCORE, its drain coupled to resistor 128 at node 130, and its gate receiving the Din signal 121. NMOS transistor N1 has its drain coupled to resistor 128 at node 130, its source coupled to ground, and its drain also receiving the Din signal 121. PMOS transistor P2 has its source coupled to VDDCORE, its drain coupled to the drain of NMOS transistor N2 to generate the Dout signal 123, and its gate coupled to node 130. NMOS transistor N2 has its source coupled to ground and its gate coupled to node 130. NMOS transistor N3 has its source and drain coupled to ground and its gate coupled to node 130.

Referring back to FIG. 2A, in operation, the H-bridge voltage divider 82 serves to generate a static (DC) threshold window. The H-bridge voltage divider 80 from FIG. 1 is the same as the H-bridge voltage divider 82 from FIG. 2A. The differential amplifier 106 compares the signal RXP at node 105 to the first threshold voltage Vthup. If the signal RXP at node 105 has a voltage lower than that of the first threshold voltage Vthup, then the output Outp 109 is asserted; if the signal RXP at node 105 has a voltage greater than that of the first threshold voltage Vthup, then the output Outp 109 is deasserted. Similarly, the differential amplifier 108 compares the signal RXP at node 105 to the second threshold voltage Vthdn, and if the signal RXP at node 105 has a voltage lower than that of the second threshold voltage Vthdn, then the output Outdown 111 is asserted. If the signal RXP at node 105 has a voltage higher than that of the second threshold voltage Vthdn, then the output Outdown 111 is deasserted. Thus, it should be appreciated that differential amplifiers 106 and 108 form a window comparator.

Since the outputs Outp 109 and Outdown 111 are fed to the exclusive OR gate 114, the output Op 117 of the exclusive OR gate 114 is asserted when one of Outp 109 or Outdown 111 is asserted while the other is deasserted. Therefore, it is to be appreciated the output Op 117 of the exclusive OR gate 114 is only asserted when the signal RXP at node 105 has a voltage greater than the first threshold voltage Vthup but less than the second threshold voltage Vthdn.

The differential amplifier 110 compares the signal RXN at node 107 to the first threshold voltage Vthup. If the signal RXN at node 107 has a voltage lower than that of the first threshold voltage Vthup, then the output Outp1 113 is asserted; if the signal RXN at node 107 has a voltage greater than that of the first threshold voltage Vthup, then the output Outp1 113 is deasserted. Similarly, the differential amplifier 112 compares the signal RXN at node 107 to the second threshold voltage Vthdn, and if the signal RXN at node 107 has a voltage lower than that of the second threshold voltage Vthdn, then the output Outdown1 115 is asserted. If the signal RXN at node 107 has a voltage higher than that of the second threshold voltage Vthdn, then the output Outdown1 115 is deasserted. Thus, it should be appreciated that differential amplifiers 110 and 112 form a window comparator.

Since the outputs Outp1 113 and Outdown1 115 are fed to the exclusive OR gate 116, the output On 119 of the exclusive OR gate 116 is asserted when one of Outp1 113 or Outdown1 115 is asserted while the other is deasserted. Therefore, it is to be appreciated the output On 119 of the exclusive OR gate 116 is only asserted when the signal RXN at node 107 has a voltage greater than the first threshold voltage Vthup but less than the second threshold voltage Vthdn.

The AND gate 118 receives the outputs Op 117 and On 119, and generates the Din signal 118 as a function of a logical AND operation between the outputs Op 117 and On 119. Assertion of the Din signal 118 indicates noise or signal. Since it is desired to produce a stable output to the controller 90 indicating whether the signal 99 should be ignored, integrating filter 120 asserts the signal Dout 123 in response to sufficient noise or signal as indicated by the signal Din 118.

Figure 3:
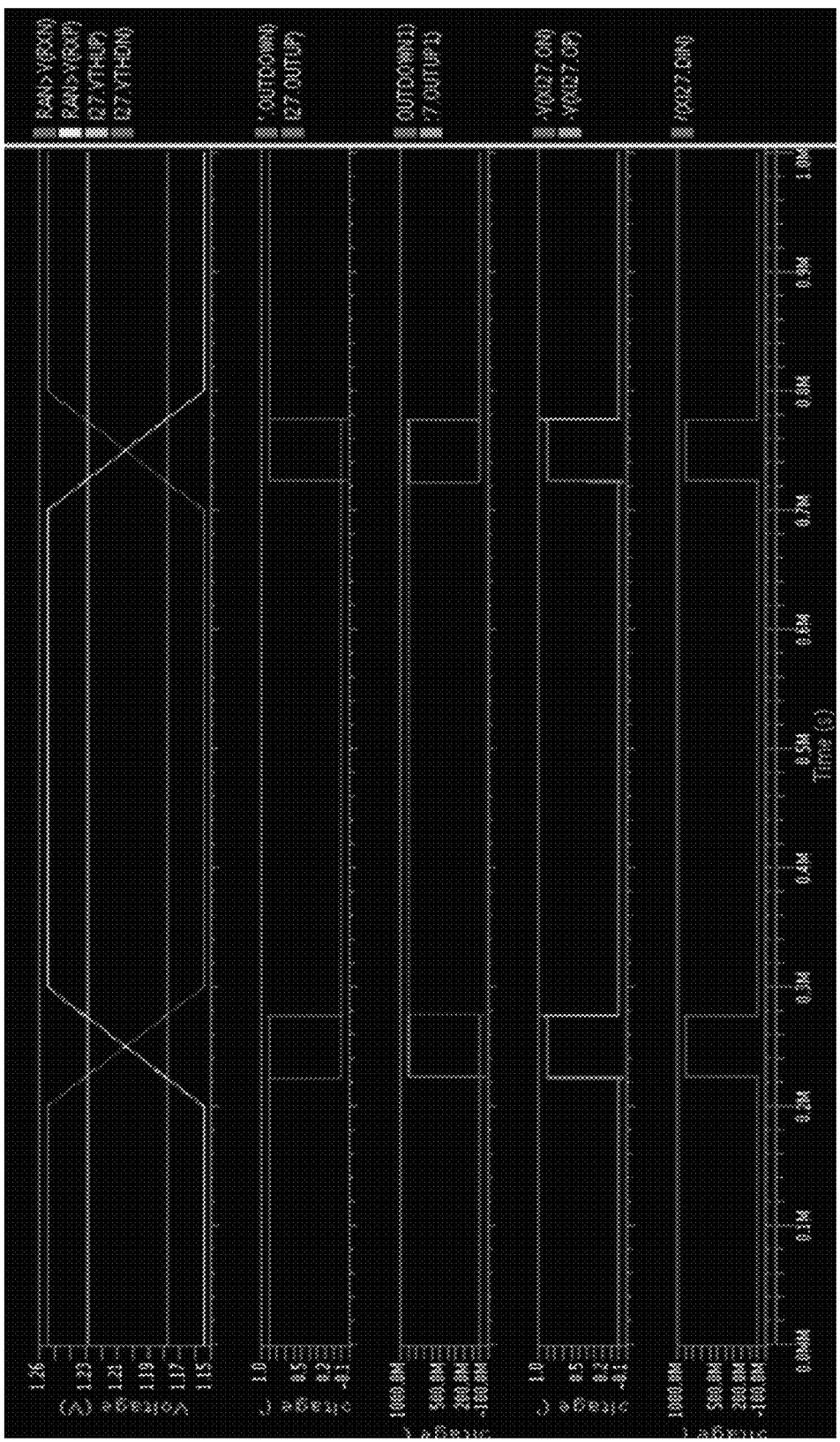
FIG. 3 is a timing diagram of the circuit of FIG. 2A in operation, when receiving a 100 mV single ended differential signal.

A timing diagram of the circuit 104 in operation when signal 99 is a 100 mV single ended differential signal is shown in FIG. 3. Here, it is to be noticed that since RXN is less than Vthdn except during transitions, and since RXP is greater than Vthup except during transitions, Din 118 is only pulsed during those transition times when both RXN and RXP are greater than Vthdn but less than Vthup. Thus, during the transitions, Din 118 goes high, but is suppressed by the filter 120, with the resultant Dout 123 remaining at 0V, meaning that the controller 90 sees signal 99 as a valid signal. When Dout 123 goes high, the input signal 99 is considered to be invalid.

Figure 4:
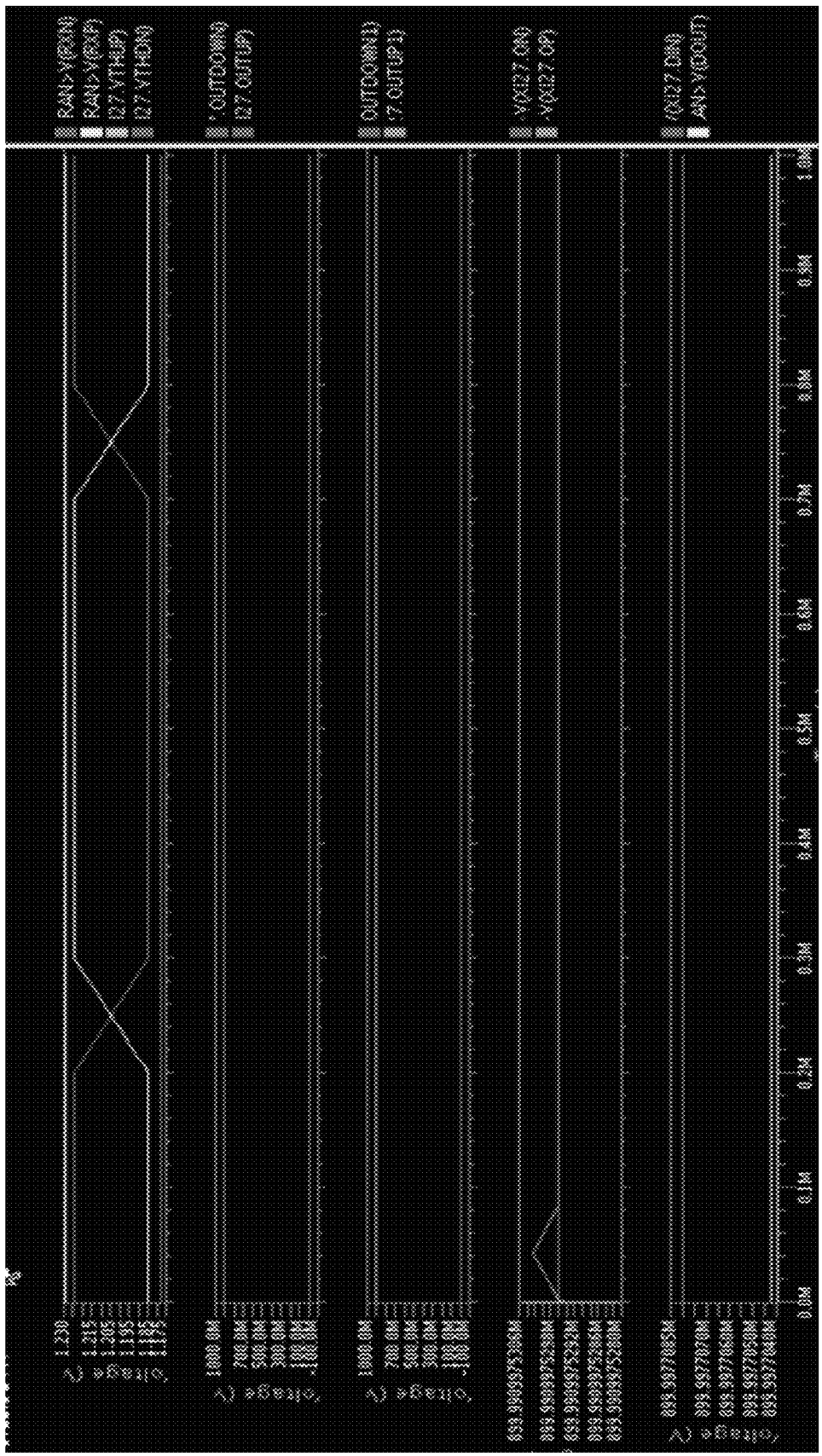
FIG. 4 is a timing diagram of the circuit of FIG. 2A in operation, when receiving a 40 mV single ended differential signal (which is not a valid signal, as less than 50 mV is assumed to be noise).

Another example is shown in FIG. 4. Here, since RXN and RXP are always greater than Vthdn but less than Vthup, and therefore Din 118 and Dout 123 remain asserted at all times. Therefore, the signal 99 in this example is to be treated by the controller 90 as an invalid signal at all times.

Figure 5:
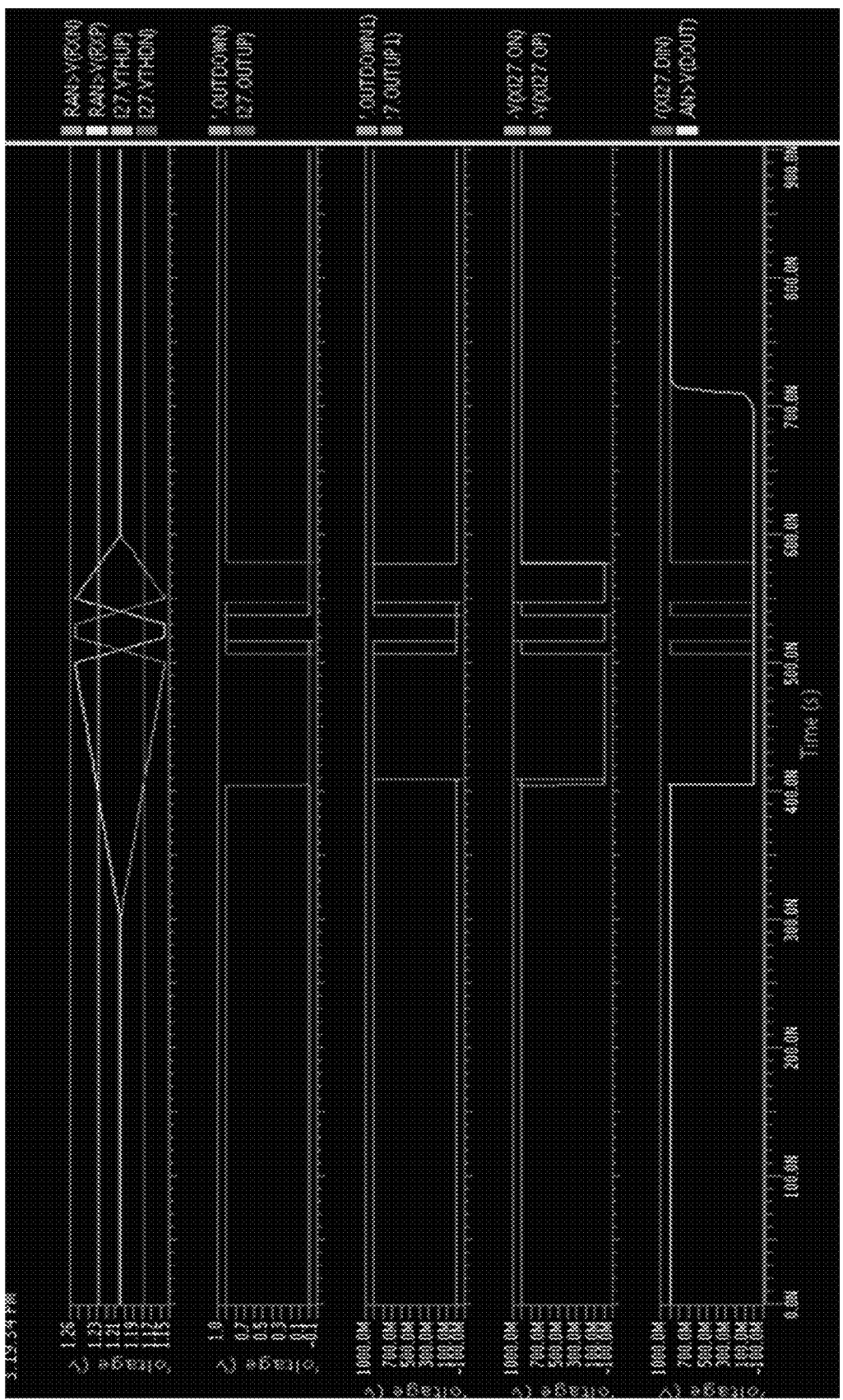
FIG. 5 is a timing diagram of the circuit of FIG. 2A in operation, when receiving a random signal input (which contains both valid and invalid values). The signal DOUT goes to 0V, indicating that differential input is valid.
Figure 6:
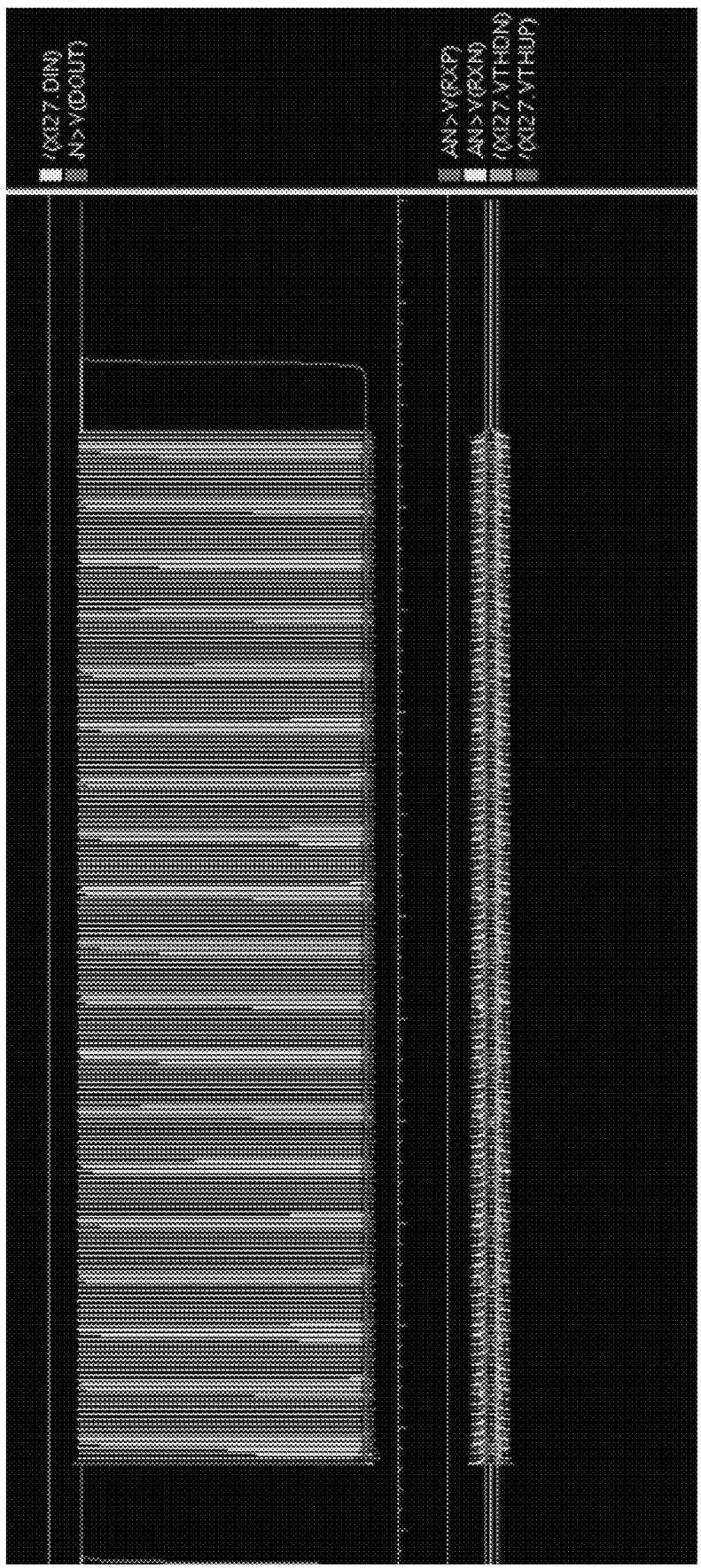
FIG. 6 is a timing diagram showing the input and output to the filter of FIG. 2 in operation.

A still further example is shown in FIG. 5. Here, initially RXN and RXP start off as the same value and greater than Vthdn but less than Vthup, but at 300 ns, begin to diverge, with RXN increasing and RXP decreasing. At 400 ns, RXN becomes greater than Vthup while RXP becomes less than Vthdn. Therefore, prior to 400 ns, Din 118 and Dout 123 remain asserted, and transition to deasserted at 400 ns to indicate presence of a valid signal 99. Only once both RXN and RXP are in the range between Vthup and Vthdn does Din 118 transition again to asserted.

Although the preceding description has been described herein with reference to particular means, materials and embodiments, it is not intended to be limited to the particulars disclosed herein; rather, it extends to all functionally equivalent structures, methods, and uses, such as are within the scope of the appended claims

The invention claimed is:

1. A circuit, comprising:
 a first window comparison circuit configured to determine whether a signal at a first differential input has a voltage that is higher than a first constant threshold voltage but lower than a second constant threshold voltage greater than the first constant threshold voltage;
 a second window comparison circuit configured to determine whether a signal at a second differential input has a voltage that is higher than the first constant threshold voltage but lower than the second constant threshold voltage;
 a logic circuit configured to generate pulses indicating presence of noise in the signals at the first and second differential inputs, each pulse being generated either: a) in response to the first window comparison circuit determining that the signal at the first differential input has a voltage higher than the first constant threshold voltage but lower than the second constant threshold voltage, but not generating any pulse in response to the first window comparison circuit determining that the signal at the first differential input has a voltage higher than the first constant threshold voltage and higher than the second constant threshold voltage, or b) in response to the second window comparison circuit determining that the signal at the second differential input has a voltage higher than the first constant threshold voltage but lower than the second constant threshold voltage, but not generating any pulse in response to the second window comparison circuit determining that the signal at the second differential input has a voltage higher than the first constant threshold voltage and higher than the second constant threshold voltage; and
 a filter circuit configured to receive the pulses from the logic circuit and to generate a flag indicating that the signal is invalid based upon pulses received from the logic circuit.

2. A circuit, further comprising:
 a first window comparison circuit configured to determine whether a signal at a first differential input has a voltage that is higher than a first constant threshold voltage but lower than a second constant threshold voltage greater than the first constant threshold voltage;

a second window comparison circuit configured to determine whether a signal at a second differential input has a voltage that is higher than the first constant threshold voltage but lower than the second constant threshold voltage;

a logic circuit configured to generate pulses indicating presence of noise in the signals at the first and second differential inputs, each pulse being generated in response to either the first window comparison circuit determining that the signal at the first differential input has a voltage higher than the first constant threshold voltage but lower than the second constant threshold voltage or the second window comparison circuit determining that the signal at the second differential input has a voltage higher than the first constant threshold voltage but lower than the second constant threshold voltage;

a filter circuit configured to receive the pulses from the logic circuit and to generate a flag indicating that the signal is invalid, based upon pulses received from the logic circuit and a threshold generating circuit comprising:
- a first resistor coupled between a power supply node and a first node;
- a second resistor coupled between the first node and a first center node;
- a third resistor coupled between the first center node and a second node;
- a fourth resistor coupled between the second node and a ground node;
- a fifth resistor coupled between the power supply node and a third node;
- a sixth resistor coupled between the third node and a second center node;
- a seventh resistor coupled between the second center node and a fourth node;
- an eighth resistor coupled between the fourth node and the ground node; and
- a first differential resistor coupled between the first and second center nodes;

wherein the first constant threshold voltage is produced at the first node;

wherein the second constant threshold voltage is produced at the fourth node.

3. The circuit of claim 2, wherein the second, third, sixth, and seventh resistors each have a first same resistance value; and wherein the first, fourth, fifth, and eighth resistors each have a second same resistance value, the second same resistance value being different than the first same resistance value.

4. A circuit, comprising:
a first window comparison circuit configured to determine whether a signal at a first differential input has a voltage that is higher than a first constant threshold voltage but lower than a second constant threshold voltage greater than the first constant threshold voltage;

a second window comparison circuit configured to determine whether a signal at a second differential input has a voltage that is higher than the first constant threshold voltage but lower than the second constant threshold voltage;

a logic circuit configured to generate pulses indicating presence of noise in the signals at the first and second differential inputs, each pulse being generated in response to either the first window comparison circuit determining that the signal at the first differential input has a voltage higher than the first constant threshold voltage but lower than the second constant threshold voltage or the second window comparison circuit determining that the signal at the second differential input has a voltage higher than the first constant threshold voltage but lower than the second constant threshold voltage; and a filter circuit configured to receive the pulses from the logic circuit and to generate a flag indicating that the signal is invalid, based upon pulses received from the logic circuit wherein the first window comparison circuit comprises:
- a first comparator having a non-inverting input coupled to the first constant threshold voltage, an inverting input coupled to the first differential input, and an output;
- a second comparator having a non-inverting input coupled to the second constant threshold voltage, an inverting input coupled to the first differential input, and an output; and
- a first exclusive OR gate having inputs coupled to the outputs of the first and second comparators, and an output.

5. The circuit of claim 4, wherein the second window comparison circuit comprises:
- a third comparator having a non-inverting input coupled to the first constant threshold voltage, an inverting input coupled to the second differential input, and an output;
- a fourth comparator having a non-inverting input coupled to the second constant threshold voltage, an inverting input coupled to the second differential input, and an output;
- a second exclusive OR gate having inputs coupled to the outputs of the third and fourth comparators, and an output.

6. The circuit of claim 5, wherein the logic circuit comprises an AND gate having inputs coupled to the outputs of the first and second exclusive OR gates, wherein the AND gate produces the pulses indicating the presence of noise in the signals at the first and second differential inputs.

7. The circuit of claim 2, further comprising:
a current balancing circuit comprising:
- a ninth resistor coupled between the power supply node and a fifth node;
- a tenth resistor coupled between the fifth node and a third center node;
- an eleventh resistor coupled between the third center node and a sixth node;
- a twelfth resistor coupled between the sixth node and the ground node;
- a thirteenth resistor coupled between the power supply node and a seventh node;
- a fourteenth resistor coupled between the seventh node and a fourth center node;
- a fifteenth resistor coupled between the fourth center node and an eighth node;
- a sixteenth resistor coupled between the eighth node and the ground node; and
- a second differential resistor coupled between the third and fourth center nodes;

wherein the first differential input is coupled to the third center node;

wherein the second differential input is coupled to the fourth center node; and a receiver having differential inputs coupled to the first and second differential inputs;

a control circuit configured to ignore output from the receiver based upon the flag indicating that the signals at the first and second different inputs are invalid.

8. The circuit of claim 7, wherein the first, fourth, fifth, eighth, ninth, twelfth, thirteenth, and sixteenth resistors have a first same resistance value; and wherein the second, third, sixth, seventh, tenth, eleventh, fourteenth, and fifteenth resistors have a second same resistance value different than the first same resistance value.

9. The circuit of claim 8, wherein the receiver comprises a low-voltage differential signaling (LVDS) receiver.

10. A circuit, comprising:
a first comparator having a non-inverting input coupled to a first constant threshold voltage, an inverting input coupled to a first differential input, and an output;
a second comparator having a non-inverting input coupled to a second constant threshold voltage, an inverting input coupled to the first differential input, and an output;
a first exclusive OR gate having inputs coupled to the outputs of the first and second comparators, and an output;
a third comparator having a non-inverting input coupled to the first constant threshold voltage, an inverting input coupled to a second differential input, and an output;
a fourth comparator having a non-inverting input coupled to the second constant threshold voltage, an inverting input coupled to the second differential input, and an output;
a second exclusive OR gate having inputs coupled to the outputs of the third and fourth comparators, and an output; and
an AND gate having inputs coupled to the outputs of the first and second exclusive OR gates, and an output.

11. The circuit of claim 10, further comprising a threshold generating circuit comprising:
a first resistor coupled between a power supply node and a first node;
a second resistor coupled between the first node and a first center node;
a third resistor coupled between the first center node and a second node;
a fourth resistor coupled between the second node and a ground node;
a fifth resistor coupled between the power supply node and a third node;
a sixth resistor coupled between the third node and a second center node;
a seventh resistor coupled between the second center node and a fourth node;
an eighth resistor coupled between the fourth node and the ground node; and
a first differential resistor coupled between the first and second center nodes;
wherein the first constant threshold voltage is produced at the first node;
wherein the second constant threshold voltage is produced at the fourth node.

12. The circuit of claim 11, further comprising a filter coupled to the output of the AND gate; and further comprising
a current balancing circuit comprising:
a ninth resistor coupled between the power supply node and a fifth node;
a tenth resistor coupled between the fifth node and a third center node;
an eleventh resistor coupled between the third center node and a sixth node;
a twelfth resistor coupled between the sixth node and the ground node;
a thirteenth resistor coupled between the power supply node and a seventh node;
a fourteenth resistor coupled between the seventh node and a fourth center node;
a fifteenth resistor coupled between the fourth center node and an eighth node;
a sixteenth resistor coupled between the eighth node and the ground node; and
a second differential resistor coupled between the third and fourth center nodes;
wherein the first differential input is coupled to the third center node;
wherein the second differential input is coupled to the fourth center node; and
a receiver having differential inputs coupled to the first and second differential inputs;
a control circuit configured to ignore output from the receiver based upon output from the filter.

13. The circuit of claim 12, wherein the first, fourth, fifth, eighth, ninth, twelfth, thirteenth, and sixteenth resistors have a first same resistance value; and wherein the second, third, sixth, seventh, tenth, eleventh, fourteenth, and fifteenth resistors have a second same resistance value different than the first same resistance value.

14. A method of determining whether a signal currently being received is valid, the method comprising:
receiving the signal at first and second differential inputs;
generating first and second constant threshold voltages using a resistive bridge;
determining whether the signal at the first differential input has a voltage that is lower than the first constant threshold voltage or higher than the second constant threshold voltage greater than the first constant threshold voltage;
determining whether the signal at the second differential input has a voltage that is lower than the first constant threshold voltage or higher than the second constant threshold voltage;
deasserting a signal to thereby indicate presence of data bits in the signals at the first and second differential inputs in response to determining that the signal at the first differential input has a voltage lower than the first constant threshold voltage or higher than the second constant threshold voltage and determining that the signal at the second differential input has a voltage lower than the first constant threshold voltage or higher than the second constant threshold voltage;
generating a flag indicating whether the signals at the first and second different inputs are invalid based upon assertion of the signal; and
processing the signal based upon absence of the flag.

15. A method of determining whether a signal currently being received is invalid, the method comprising:
receiving the signal at first and second differential inputs;
determining whether the signal at the first differential input has a voltage that is higher than a first constant threshold voltage but lower than a second constant threshold voltage greater than the first constant threshold voltage;
determining whether the signal at the second differential input has a voltage that is higher than the first constant threshold voltage but lower than the second constant threshold voltage;

generating pulses indicating lack of presence of data bits in the signals at the first and second differential inputs, each pulse being generated in response to determining that the signal at the first differential input has a voltage higher than the first constant threshold voltage but lower than the second constant threshold voltage and determining that the signal at the second differential input has a voltage higher than the first constant threshold voltage but lower than the second constant threshold voltage, but not being generated if the signal at the first differential input has a voltage higher than the first constant threshold voltage and the second constant threshold voltage;

generating a flag indicating whether the signals at the first and second different inputs are invalid; and ignoring the signal based upon the flag.

16. A method of determining whether a signal currently being received is invalid, the method comprising;

receiving the signal at first and second differential inputs;

generating first and second constant threshold voltages using a resistive bridge;

determining whether the signal at the first differential input has a voltage that is higher than the first constant threshold voltage but lower than the second constant threshold voltage greater than the first constant threshold voltage;

determining whether the signal at the second differential input has a voltage that is higher than the first constant threshold voltage but lower than the second constant threshold voltage;

generating pulses indicating lack of presence of data bits in the signals at the first and second differential inputs, each pulse being generated in response to determining that the signal at the first differential input has a voltage higher than the first constant threshold voltage but lower than the second constant threshold voltage and determining that the signal at the second differential input has a voltage higher than the first constant threshold voltage but lower than the second constant threshold voltage;

generating a flag indicating whether the signals at the first and second different inputs are invalid; and ignoring the signal based upon the flag.

* * * * *